United States Patent
Bojarczuk et al.

(10) Patent No.: US 8,518,766 B2
(45) Date of Patent: Aug. 27, 2013

(54) METHOD OF FORMING SWITCHING DEVICE HAVING A MOLYBDENUM OXYNITRIDE METAL GATE

(75) Inventors: Nestor A. Bojarczuk, Poughkeepsie, NY (US); Michael P. Chudzik, Danbury, CT (US); Matthew W. Copel, Yorktown Heights, NY (US); Supratik Guha, Chappaqua, NY (US); Richard A. Haight, Mahopac, NY (US); Vijay Narayanan, New York, NY (US); Martin P. O'Boyle, Cortlandt Manor, NY (US); Vamsi K. Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/536,366

(22) Filed: Jun. 28, 2012

(65) Prior Publication Data

US 2012/0270385 A1 Oct. 25, 2012

Related U.S. Application Data

(62) Division of application No. 12/545,343, filed on Aug. 21, 2009.

(51) Int. Cl.
*H01L 21/336* (2006.01)
*H01L 21/8234* (2006.01)
*H01L 21/3205* (2006.01)
*H01L 21/4763* (2006.01)
*H01L 21/70* (2006.01)

(52) U.S. Cl.
USPC .............................. 438/197; 438/585; 257/407

(58) Field of Classification Search
None
See application file for complete search history.

(56) References Cited

U.S. PATENT DOCUMENTS

| 6,472,278 | B1 | 10/2002 | Marshall et al. |
| 7,030,430 | B2 | 4/2006 | Doczy et al. |
| 7,172,955 | B2 | 2/2007 | Matsuo et al. |
| 7,365,378 | B2 | 4/2008 | Huang et al. |
| 7,521,706 | B2 | 4/2009 | Jeong et al. |
| 7,655,550 | B2 * | 2/2010 | Schaeffer et al. ............. 438/592 |
| 2006/0267113 | A1 | 11/2006 | Tobin et al. |
| 2007/0272975 | A1 | 11/2007 | Schaeffer et al. |
| 2007/0284677 | A1 | 12/2007 | Chang et al. |
| 2008/0193798 | A1 | 8/2008 | Lemon et al. |
| 2008/0233693 | A1 | 9/2008 | Lee et al. |
| 2008/0258822 | A1 | 10/2008 | Matsuzaki |
| 2009/0095980 | A1 | 4/2009 | Yu et al. |

OTHER PUBLICATIONS

Lu, Jiang et al. In "Physical and electrical properties of Ta—N, Mo—N, and W—N electrodes on HfO2 high-k gate dielectric", 2006, J. Vac. Sci. Technol. B, vol. 24, pp. 349-357.*
Singanamalla, R. et al. In "Low VT Mo(O,N) metal gate electrodes on HfSiON for sub-45 nm pMOSFET Devices", 2006, Electron Devices Meetings, IEDM '06. International, pp. 1-4.*
Definition of Above (n.d.); The American Heritage Dictionary of the English Language, Fourth Edition (2003); retrieved May 3, 2012 from http://www.thefreedictionary.com/above; p. 1-4.

* cited by examiner

*Primary Examiner* — Michael Jung
(74) *Attorney, Agent, or Firm* — Cantor Colburn LLP; Vazken Alexanian

(57) ABSTRACT

A field effect transistor (FET) includes a body region and a source region disposed at least partially in the body region. The FET also includes a drain region disposed at least partially in the body region and a molybdenum oxynitride (MoNO) gate. The FET also includes a dielectric having a high dielectric constant (k) disposed between the body region and the MoNO gate.

8 Claims, 2 Drawing Sheets

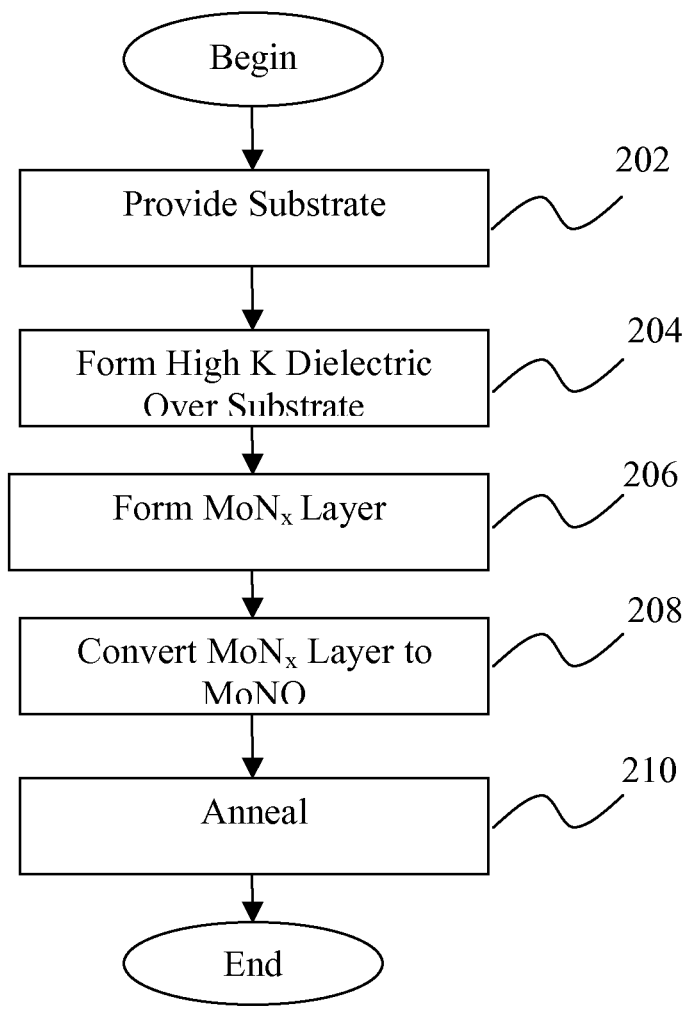

METHOD OF FORMING SWITCHING DEVICE HAVING A MOLYBDENUM OXYNITRIDE METAL GATE

CROSS-REFERENCE TO RELATED APPLICATIONS AND PRIORITY CLAIM

This application is a Divisional Application of U.S. Non-Provisional application Ser. No. 12/545,343, entitled "SWITCHING DEVICE HAVING A MOLYBDENUM OXYNITRIDE METAL GATE", filed Aug. 21, 2009, under 35 U.S.C. §120, which is incorporated herein by reference in its entirety.

BACKGROUND

The present invention relates to switching devices, and more specifically, to metal gate transistors.

The term high-k dielectric refers to a material with a high dielectric constant (k) (as compared to silicon dioxide) used in semiconductor manufacturing processes which replaces the silicon dioxide gate dielectric. The implementation of high-k gate dielectrics is one of several strategies developed to allow further miniaturization of microelectronic components.

Silicon dioxide has been used as a gate oxide material for decades. As transistors have decreased in size, the thickness of the silicon dioxide gate dielectric has steadily decreased to increase the gate capacitance and thereby drive current and device performance. As the thickness scales below 2 nm, leakage currents due to tunneling increase drastically, leading to unwieldy power consumption and reduced device reliability. Replacing the silicon dioxide gate dielectric with a high-k material allows increased gate capacitance without the concomitant leakage effects.

SUMMARY

According to one embodiment of the present invention, a field effect transistor (FET) is disclosed. The FET of this embodiment includes a body region and a source region disposed at least partially in the body region. The FET of this embodiment also includes a drain region disposed at least partially in the body region and a molybdenum oxynitride (MoNO) gate. The FET of this embodiment also includes a dielectric having a high dielectric constant (k) disposed between the body region and the MoNO gate.

Another embodiment of the present invention is directed to a method of forming a field effect transistor (FET). The method of this embodiment includes forming a high k dielectric layer over a body region, forming a molybdenum nitride ($MoN_x$) layer over the high k dielectric layer, and converting the $MoN_x$ to molybdenum oxynitride (MoNO).

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 is a flow diagram illustrating a method for forming a gate structure for a P-FET according to one embodiment of the present invention.

DETAILED DESCRIPTION

Figure 1:
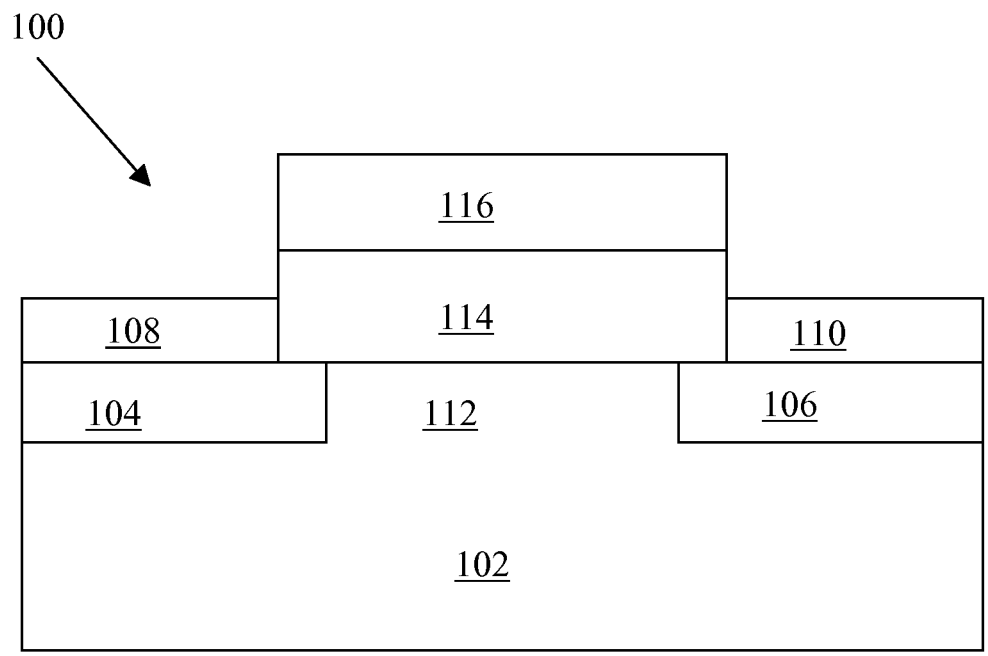
FIG. 1 is a cross-sectional view of a field-effect transistor (FET) according to one embodiment of the present invention.

In order to fabricate a useful field-effect transistor (FET) metal-oxide-semiconductor (MOS) a high work function material must be deposited as the gate metal atop a dielectric material resident on a silicon (Si) substrate. In some applications the dielectric can be silicon dioxide ($SiO_2$). In more advanced devices, however, a high dielectric having a higher k value than $SiO_2$, such hafnium oxide ($HfO_2$), to allow for a physically thicker layer, and hence reduced current leakage.

The use of a high work function metal is needed to induce band bending in the underlying Si body which brings the valence band edge of Si close to the Fermi level, thereby reducing the threshold voltage to a minimum (~100-200 meV) acceptable level for good device performance. The "work function" of a metal is the minimum energy (usually measured in electron volts) needed to remove an electron from a solid to a point immediately outside the solid surface (or energy needed to move an electron from the Fermi energy level into vacuum).

In addition, in order for the gate metal to be acceptable, it should maintain this high effective work function by withstanding integration process anneal temperatures up to 1000° C. Typically after this high temperature anneal the Fermi level moves to the middle of the Si gap which is unsuitable for P-FET operation. Prior to the invention disclosed herein, no candidate P-FET gate metals have been identified which maintain this high effective work function after 1000° C. anneals.

With reference now to FIG. 1, a FET 100 according to an embodiment of the present invention is disclosed. In one embodiment, the FET 100 may include a substrate 102. The substrate 102 may be formed, for example, of a semiconductor material. The FET 100 may also include a source region 104 and a drain region 106. In one embodiment, in the event that the FET 100 is a P-FET, the substrate 102 may be formed of an N-type semiconductor and referred to as a "body" or "base" and the source region 104 and the drain region 106 may be formed of a P-type semiconductor.

The FET 100 may also include a source contact 108 formed on top of the source region 104 and a drain contact 110 formed on top of the drain region 106. The portion of the body 102 between the source region 104 and the drain region 106 is referred to herein as the channel 112.

The FET 100 may also include a gate dielectric 114 disposed above the channel 112. In one embodiment, the gate dielectric 114 may also be disposed such that it is above a portion of one or both of the source region 104 and the drain region 106. In one embodiment, the gate dielectric 114 is disposed only over the channel 112. That is, the gate dielectric 114 may not be disposed over either the source region 104 or the drain region 106. As shown, the gate dielectric 114 contacts the source contact 108 and the drain contact 110. In one embodiment, the gate dielectric 114 does not contact one or both of the source contact 108 and the drain contact 110.

In one embodiment, the gate dielectric 114 is formed a dielectric having a high-k value as compared to silicon dioxide. An example of such a material is a hafnium based material such as $HfO_2$ or a similar material. As used herein, a high-k dielectric shall refer to a material that has a k value of 3.0 or greater. In a particular embodiment, the high-k dielectric may have a k value between 4.0 and 100.

The FET 100 may also include a gate metal 116 disposed above the gate dielectric 114. In one embodiment, the gate metal 116 is formed of molybdenum oxynitride (MoNO). Of course, variations may exist so, in one embodiment, the gate metal may be formed of $MoNO_x$.

In has been discovered that that MoNO (or $MoNO_x$) exhibits high thermal stability and maintains a high effective work function suitable for the gate metal of a P-FET MOS device. In one embodiment, the gate metal is a one nanometer thick layer of MoNO. Experimentation has shown that MoNO maintains an effective work function stability after anneals to 1000° C. for 5 seconds, the typical temperature and length of anneal that devices are subjected to during processing.

FIG. 2 shows a method of forming a P-FET with a metal gate according to one embodiment of the present invention. At a block 202 at least an n-doped silicon silicon substrate is provided. At a block 204 a high k dielectric is formed over the substrate. Of course, other layers may be between the high k dielectric and the substrate. The high k dielectric may be, for example, $HfO_2$. Of course, other high k dielectrics may be utilized. In one embodiment, a 2.5-3 nm thick layer of $HfO_2$ is formed over the substrate. At this point, in one embodiment, the resultant structure may be annealed at 450° C. to remove atmospheric water an other adsorbed contaminants but this is not required.

At a block 206 a layer of $MoN_x$ is formed over the high k dielectric layer. In one embodiment, this may include depositing a layer molybdenum (Mo) by electron deposition. The layer may be, for example, 2 nm thick. The structure may then be exposed to $NH_3$ which forms MoNx (here x represents several possible stoichiometries). In one embodiment, the structure is exposed to 100 millitorr of $NH_3$ at 450° C.

In another embodiment, electron beam deposition of Mo is carried out to a thickness of 5 nm in an $NH_3$ ambient at a temperature of 450° C. In this embodiment, the $NH_3$ ambient may have a partial pressure of $3\times10^{-6}$ torr.

In yet another embodiment, in a molecular beam epitaxy (MBE) system, MoNx is formed by deposition of Mo while a beam of nitrogen (N) atoms (dissociated in a remote plasma) is directed to the structure resulting in the formation of molybdenum nitride (MoNx). This may be carried out, for example, at 300° C.

Regardless of how the $MoN_x$ is formed, at a block 208, the $MoN_x$ is converted to MoNO. The may be done, for example, by annealing the structure in the presence of oxygen. In one embodiment, the structure may be exposed to 0.1 torr to 10 torr $O_2$ for a predetermined time. In a specific example, the structure could be exposed to 1 torr $O_2$ for 2 minutes at a temperature of 450° C. to convert the $MoN_x$ to MoNO.

Many subsequent processing steps may be performed following block 208. Regardless, at a block 210 the resulting structure is annealed. In one embodiment, the structure is annealed at a temperature above 500° C. In another embodiment, the structure is annealed at a temperature at or about 1000° C.

One advantage of utilizing MoNO as a gate metal for a high-k PFET as disclosed herein is that test data has shown after exposure to a 1000° C. anneal MoNO retains a work function suitable for use in a high-k P-FET.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a field effect transistor (FET), the method comprising:
   forming a high k dielectric layer over a body region;
   forming a molybdenum nitride ($MoN_x$) layer over the high k dielectric layer; and
   converting the $MoN_x$ to molybdenum oxynitride (MoNO), wherein converting includes exposing the $MoN_x$ to $O_2$.

2. The method of claim 1, wherein the $MoN_x$ is exposed to 0.1 torr to 10 torr $O_2$.

3. The method of claim 1, wherein the $MoN_x$ is exposed to 1 torr $O_2$ at a temperature of about 450 ° C.

4. The method of claim 1, further comprising:
   annealing the FET at a temperature in excess of 500° C.

5. The method of claim 4, wherein annealing includes annealing the FET at a temperature of about 1000° C.

6. A method of forming a field effect transistor (FET), the method comprising:
   forming a high k dielectric layer over a body region;
   forming a molybdenum nitride ($MoN_x$) the high k dielectriclayer; and
   converting the $MoN_x$ to molybdenum oxynitride (MoNO), wherein forming the $MoN_x$ layer includes:
   depositing a layer of molybdenum (Mo) having a thickness of about 2 nanometers (nm); and
   exposing the Mo layer to 100 millitorr of $NH_3$.

7. A method of forming a field effect transistor (FET), the method comprising:
   forming a high k dielectric layer over a body region;
   forming a molybdenum nitride ($MoN_x$) layer over the high k dielectric layer; and converting the $MoN_x$ to molybdenum oxynitride (MoNO) wherein forming the $MoN_x$ layer includes:
depositing molybdenum (Mo) to a thickness of about 5 nm in an $NH_3$ ambient.

8. A method of forming a field effect transistor (FET), the method comprising:
forming a high k dielectric layer over a body region;
forming a molybdenum nitride ($MoN_x$) layer over the high k dielectric layer; and
converting the $MoN_x$ to molybdenum oxynitride MoNO) wherein forming the MoNx layer includes:
depositing molybdenum (Mo) while a beam of nitrogen (N) is directed at the FET.

* * * * *